(12) United States Patent
Tanaka et al.

(10) Patent No.: US 8,697,026 B2
(45) Date of Patent: *Apr. 15, 2014

(54) HIGH EFFICIENT CARBON NANOTUBE SEPARATION METHOD

(75) Inventors: Takeshi Tanaka, Ibaraki (JP); Hiromichi Kataura, Ibaraki (JP); Hehua Jin, Ibaraki (JP); Yasumitsu Miyata, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 862 days.

This patent is subject to a terminal disclaimer.

(21) Appl. No.: 12/451,607

(22) PCT Filed: May 21, 2008

(86) PCT No.: PCT/JP2008/059327
§ 371 (c)(1),
(2), (4) Date: Mar. 26, 2010

(87) PCT Pub. No.: WO2008/143281
PCT Pub. Date: Nov. 27, 2008

(65) Prior Publication Data
US 2010/0189626 A1    Jul. 29, 2010

(30) Foreign Application Priority Data

May 21, 2007  (JP) ................. 2007-134274

(51) Int. Cl.
*D01F 9/12* (2006.01)
*D01C 5/00* (2006.01)
*B01J 19/08* (2006.01)
*B04B 15/02* (2006.01)
*B01D 11/02* (2006.01)
*B32B 9/00* (2006.01)

(52) U.S. Cl.
USPC .......... 423/447.1; 423/447.2; 423/447.3; 423/445 B; 494/14; 422/261; 428/367

(58) Field of Classification Search
None
See application file for complete search history.

(56) References Cited

U.S. PATENT DOCUMENTS

2005/0214198 A1   9/2005  Park et al.
2010/0173142 A1*  7/2010  Cha .................. 428/292.1

FOREIGN PATENT DOCUMENTS

JP   2001-126537   5/2001
JP   2005-095806   4/2005

(Continued)

OTHER PUBLICATIONS

Strano et al.; Selective Functionalization and Free Solution Electrophoresis of Single-Walled Carbon Nanotubes: Separate Enrichment of Metallic and Semiconducting SWNT; Chem. Mater.; 19, 1571-1576; 2007.*

(Continued)

*Primary Examiner* — Guinever Gregorio
(74) *Attorney, Agent, or Firm* — Wenderoth, Lind & Ponack, L.L.P.

(57) ABSTRACT

Provided is a method of electrophoresis of carbon nanotube for separating them into metallic carbon nanotubes and semiconducting carbon nanotubes, and the method comprises a step of electrifying a carbon nanotube sealed gel in which carbon nanotubes are dispersed in a gel.

According to the separation method, metallic CNT and semiconducting CNT may be efficiently and heavily separated and purified from each other in CNT containing both the two within a short period of time and in a simplified manner by the use of inexpensive facilities and according to a simple process, and the method can be readily scaled up, in which CNT can be separated industrially extremely advantageously.

8 Claims, 10 Drawing Sheets

(56) References Cited

FOREIGN PATENT DOCUMENTS

| JP | 2005-194180 | 7/2005 |
|----|-------------|--------|
| WO | 2006/013788 | 2/2006 |

OTHER PUBLICATIONS

International Search Report issued Jun. 24, 2008 in International (PCT) Application No. PCT/JP2008/059327.

Wakizaka, O.Y. et al., "Electrophoretic Behavior of Metallic and Semiconducting Single-Walled Carbon Nanotubes", Dai 53 Kai Extended Abstracts, Japan Society of Applied Physics and Related Societies, The Japan Society of Applied Physics, vol. 1, 2006, p. 524, with attached English translation.

Hong, S. et al., "Electrical Transport Characteristics of Surface-Conductance-Controlled, Dielectrophoretically Separated Single-Walled Carbon Nanotubes", Langmuir, vol. 23, 2007, pp. 4749-4752.

Kim, W. et al., "Selective Functionalization and Free Solution Electrophoresis of Single-Walled Carbon Nanotubes: Separate Enrichment of Metallic and Semiconducting SWNT" Chem. Mater., vol. 19, 2007, pp. 1571-1576.

* cited by examiner

HIGH EFFICIENT CARBON NANOTUBE SEPARATION METHOD

TECHNICAL ART

The present invention relates to a method for efficiently separating metallic carbon nanotubes and semiconducting carbon nanotubes from each other in carbon nanotubes (CNT).

BACKGROUND ART

CNT have excellent properties of electric characteristics, mechanical strength and others, and studies and developments thereof as ultimate new materials are being made energetically. CNT are produced in various methods of a laser vaporization method, an arc discharge method, a chemical vapor deposition method (CVD method), etc. At present, however, they are produced only as a mixture morphology of metallic CNT and semiconducting CNT in any production methods. In practical use, the properties of either one only of metallic or semiconducting CNT are needed in many cases, and therefore, the studies of separating and purifying metallic or semiconducting CNT alone from a CNT mixture are considered extremely important from the viewpoint of the practical use of CNT.

Heretofore, there are given some reports relating to separation of metallic CNT and semiconducting CNT from each other; however, there is known nothing applicable to large-scale production. For example, there are known a method of electrophoresing CNT dispersed with a surfactant, on a microelectrode (Non-Patent Reference 1); a method of using amines as a dispersant in a solvent (Non-Patent References 2, 3); and a method of selectively firing semiconducting CNT with hydrogen peroxide (Non-Patent Reference 4); however, these are problematic in that only metallic CNT could be obtained in all of them and the collection rate is low.

Also known is a method of separating CNT dispersed in a surfactant into metallic/semiconducting CNT through density-gradient ultracentrifugation (Non-Patent Reference 5); however, this requires an extremely expensive instrument of an ultracentrifuge and takes a long separation time of 12 hours, and has some other difficulties in that enlarging the instrument is limited and a large amount of samples could not be processed.

Further known is a method comprising dispersing CNT with a nonionic surfactant followed by applying a direct-current field to the solution to thereby make the metallic CNT move toward the cathode side while the semiconducting CNT are kept remaining on the anode side (Non-Patent References 6, 7). However, the method has some difficulties in that it has a necessity of using a nonionic surfactant of low dispersing ability, the collection rate is low, the separation time is 18 hours and is long, and it is difficult to accurately collect the separated product since the method is electrophoresis in a free solution.

Also known is a report of trying separation of metallic and semiconducting CNT from each other by controlling the pH and the ionic intensity of a CNT solution dispersed with a surfactant to cause a different degree of protonation depending on the type of CNT, followed by applying an electric field to the resulting solution for the intended separation (Patent Reference 1). However, the method requires a step of pre-treating the suspended nanotube mixture with a strong acid for pH and ionic intensity control prior to separation, and therefore, severe process control for the step is inevitable and finally, in addition, the separation of metallic and semiconducting CNT from each other could not be attained.

Non-Patent Reference 1: Advanced Materials 18, (2006) 1468-1470
Non-Patent Reference 2: J. Am. Chem. Soc. 127, (2005) 10287-10290
Non-Patent Reference 3: J. Am. Chem. Soc. 128, (2006) 12239-12242
Non-Patent Reference 4: J. Phys. Chem. B 110, (2006) 25-29
Non-Patent Reference 5: Nature Nanotechnology 1, (2006) 60-65
Non-Patent Reference 6: Preprint for 32nd Fullerene Nanotube General Symposium Talk, p. 136, 3P-7 (Feb. 15, 2007, Meijo University, Aichi)
Non-Patent Reference 7: Preprint for 54th Applied Physics-Related Joint Lecture Presentation, Spring, 2007, No. 3, p. 1593, 27p-ZR-1 (Mar. 27, 2007, Aoyama Gakuin University, Kanagawa)
Patent Reference 1: JP-T 2005-527455

DISCLOSURE OF THE INVENTION

Problems that the Invention is to Solve

An object of the present invention is to provide an industrially extremely advantageous CNT separation method capable of efficiently and heavily separating and purifying metallic CNT and semiconducting CNT from each other from CNT containing both of them within a short period of time by the use of inexpensive facilities and according to a simple process, and capable of being readily scaled up.

Means for Solving the Problems

The present inventors have promoted long-lasting continuous studies relating to the relationship between a separation method and an electrophoresis method for a mixture of metallic CNT and semiconducting CNT and, as a result, have found unexpectedly that, in separating the mixture, when CNT to be separated is previously dispersed in a "gel" to prepare a dispersion thereof but not in a "liquid" and when the gel dispersion is electrified, then only metallic CNT could be electrophoresed while semiconducting CNT could not be electrophoresed but remain in the site, and therefore the mixture can be separated efficiently.

The invention has been made on the basis of the novel findings.

Specifically, the present application provides the following invention.

<1> A carbon nanotube separation method comprising:
a step of putting a medium for electrophoresis into a container for separation,
a step of putting a carbon nanotube sealed gel into the separation container,
a step of electrifying the separation container containing the electrophoresis medium and the carbon nanotube sealed gel therein,
a step of forming a semiconducting carbon nanotube region in a state not moving through electrophoresis but staying in the carbon nanotube sealed gel, a mixed region of semiconducting carbon nanotubes and metallic carbon nanotubes, and a metallic carbon nanotube region in the separation medium,
a step of forming a semiconducting carbon nanotube region in a state not moving through electrophoresis but staying in the carbon nanotube sealed gel, a mixed region of metallic carbon nanotubes and semiconducting carbon nanotubes, and a metallic carbon nanotube region in which the proportion of the metallic carbon nanotubes to the semiconducting carbon nanotubes in the separation medium is larger than the proportion of the metallic carbon nanotubes to the semiconducting carbon nanotubes in the carbon nanotube sealed gel.

<2> A carbon nanotube separation method comprising:

a step of putting a medium for electrophoresis into a container for separation, a step of putting a carbon nanotube sealed gel into the separation container, a step of electrifying the separation container containing the electrophoresis medium and the carbon nanotube sealed gel therein, a step of forming a semiconducting carbon nanotube region in a state not moving through electrophoresis but staying in the carbon nanotube sealed gel, a mixed region of semiconducting carbon nanotubes and metallic carbon nanotubes, and a metallic carbon nanotube region in the separation medium, a step of forming a semiconducting carbon nanotube region in a state not moving through electrophoresis but staying in the carbon nanotube sealed gel, and a metallic carbon nanotube region in which the proportion of the metallic carbon nanotubes to the semiconducting carbon nanotubes in the separation medium is larger than the proportion of the metallic carbon nanotubes to the semiconducting carbon nanotubes in the carbon nanotube sealed gel.

<3> The carbon nanotube separation method of <1> or <2>, wherein the medium for electrophoresis is a gel.

<4> The carbon nanotube separation method of <1> or <2>, wherein the electrophoresis is attained in a state where the separation liquid is insulated from the external world such as buffer or the like on all the other sides than the side in the electrophoresis direction thereof.

<5> The carbon nanotube separation method of <1> or <2>, wherein the carbon nanotube sealed gel in which carbon nanotubes are dispersed contains a surfactant.

<6> The carbon nanotube separation method of <5>, wherein the surfactant is an anionic surfactant.

<7> The carbon nanotube separation method of <6>, wherein the anionic surfactant is an alkyl sulfate salt, sodium cholate, or a mixture of an alkyl sulfate salt and sodium cholate.

<8> The carbon nanotube separation method of <7>, wherein the alkyl sulfate salt is sodium dodecyl sulfate or sodium tetradecyl sulfate.

<9> Metallic carbon nanotubes produced according to the carbon nanotube separation method of <1> or <2>.

<10> Semiconducting carbon nanotubes produced according to the carbon nanotube separation method of <1> or <2>.

<11> A carbon nanotube separation container provided with a semiconducting carbon nanotube region in a state not moving through electrophoresis but staying in a carbon nanotube sealed gel, a mixed region of metallic carbon nanotubes and semiconducting carbon nanotubes, and a metallic carbon nanotube region in which the proportion of the metallic carbon nanotubes to the semiconducting carbon nanotubes in a separation medium is larger than the proportion of the metallic carbon nanotubes to the semiconducting carbon nanotubes in the carbon nanotube sealed gel, wherein the semiconducting carbon nanotube region and the mixed region and the metallic carbon nanotube region are disposed in the direction of electrophoresis.

<12> A carbon nanotube separation container provided with a semiconducting carbon nanotube region in a state not moving through electrophoresis but staying in a carbon nanotube sealed gel, and a metallic carbon nanotube region in which the proportion of the metallic carbon nanotubes to the semiconducting carbon nanotubes in a separation medium is larger than the proportion of the metallic carbon nanotubes to the semiconducting carbon nanotubes in the carbon nanotube sealed gel, wherein the semiconducting carbon nanotube region and the metallic carbon nanotube region are disposed in the direction of electrophoresis.

<13> The separation container of <11>, wherein, in the mixed region of metallic carbon nanotubes and semiconducting nanotubes, the proportion of the metallic carbon nanotubes to the semiconducting carbon nanotubes is nearly equal to the proportion of the metallic carbon nanotubes to the semiconducting carbon nanotubes in the gel.

Advantage of the Invention

According to the invention, metallic CNT and semiconducting CNT may be efficiently and heavily separated and purified from each other in CNT containing both the two within a short period of time by the use of inexpensive facilities and according to a simple process.

The method can be readily scaled up, and can be said to be an industrially extremely advantageous CNT separation method.

BEST MODE FOR CARRYING OUT THE INVENTION

Figure 1:
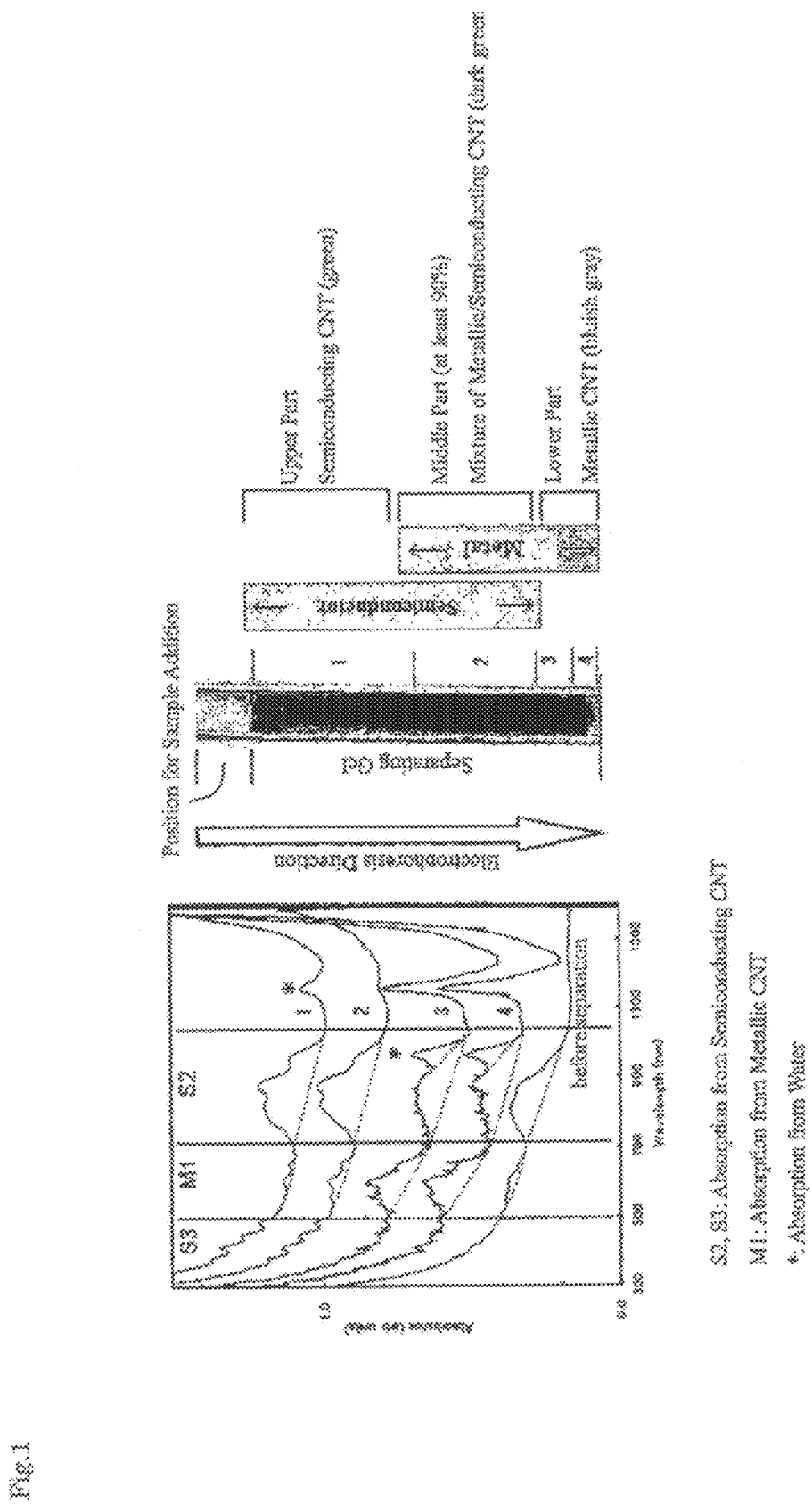
FIG. 1 Gel picture and photoabsorption spectrum of CNT solution (Laser-CNT (thin), SDS) after electrophoresis.

In investigating a method of separating metallic CNT and semiconducting CNT from each other in a CNT mixture containing them, the present inventors first tried a gel electrophoresis method for a CNT dispersion and confirmed the separation of metallic CNT and semiconducting CNT from each other (FIG. 1). Semiconducting CNT were separated in the upper part of the gel, while on the other hand, metallic CNT were separated in the lower part nearer to the electrophoresis leading part. However, in the middle part, there existed an unseparated mixture of metallic/semiconducting CNT in an amount of at least about 90% of the original mixture.

Figure 2:
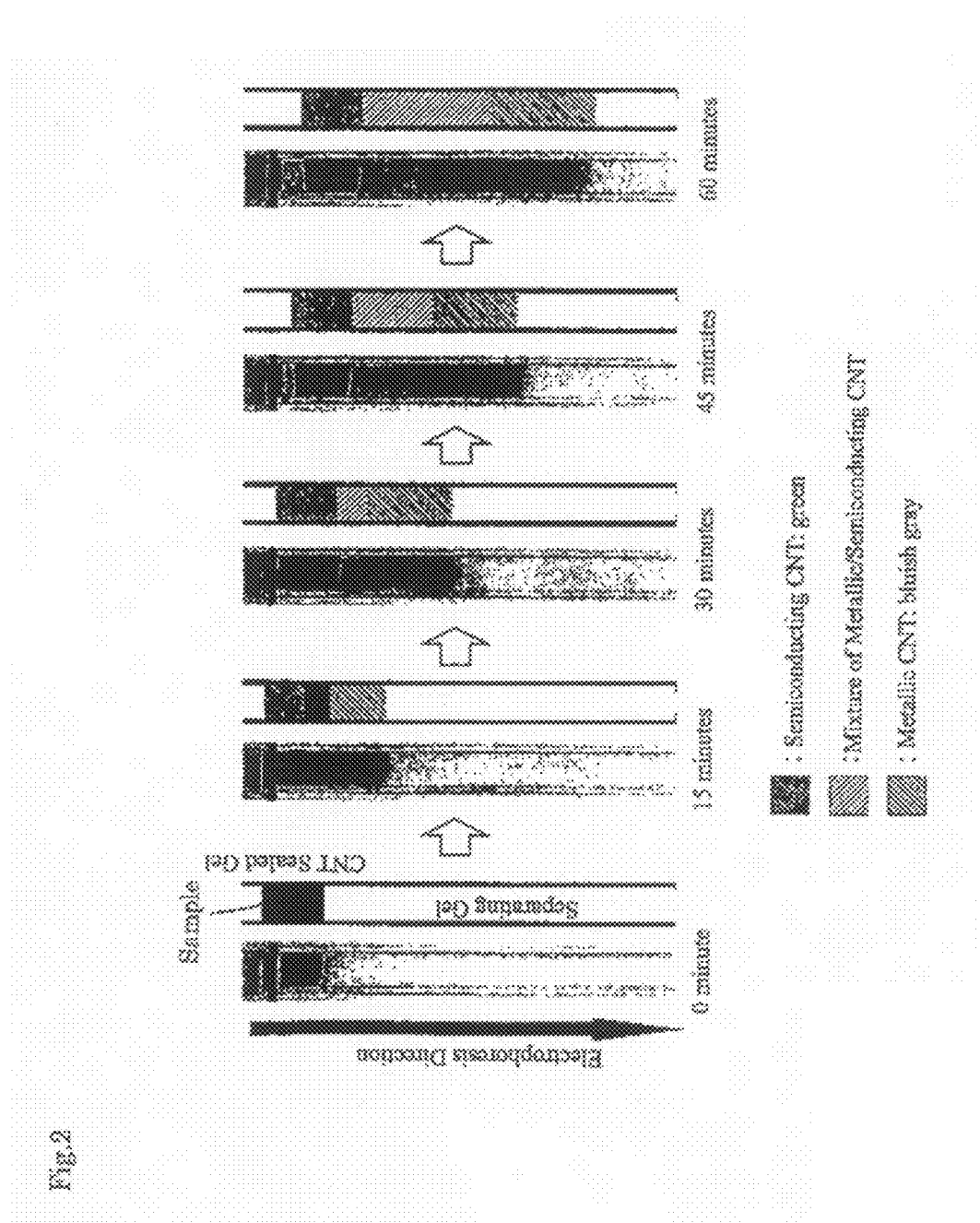
FIG. 2 Successive pictures and graphic views in electrophoresis of CNT sealed gel (Example 1) (Laser-CNT (thin), SDS).

The inventors further assiduously investigated for the purpose of enhancing the separation efficiency, and have found that, when a sample prepared by sealing sodium tridecyl sulfate (SDS)-dispersed CNT in a gel (prepared by mixing SDS-dispersed CNT and dissolved agarose gel followed by cooling and solidifying the mixture) is processed for electrophoresis, then semiconducting CNT remain in the originally sealed gel and metallic CNT alone are electrophoresed (Example 1, FIG. 2). This phenomenon is an epoch-making one heretofore not reported in the art. Based on this finding, metallic CNT and semiconducting CNT can be separated from each other extremely efficiently and at a high collection rate from a CNT mixture, and the method can be readily scaled up, therefore enabling large-scale mass-production of metallic/semiconducting CNT.

Carbon nanotubes to be used in the step of preparing a CNT dispersion are not specifically defined, and the invention may be directed to any CNT containing metallic carbon nanotubes (metallic CNT) and semiconducting carbon nanotubes (semiconducting CNT) irrespective of the production method, the diameter, the length and the structure (single-wall, multi-wall) thereof.

In general, CNT produced in an arc discharge method are said to contain single-wall CNT, amorphous carbon, metal catalyst, etc.; and as commercial products of such CNT, there is mentioned CarboLex-AP (by CarboLex).

In general, carbon nanotubes produced in a laser evaporation method (Laser-CNT) are said to contain single-wall CNT, amorphous carbon, metal catalyst, etc.

In general, carbon nanotubes produced in a chemical vapor deposition method are said to contain single-wall CNT, amorphous carbon, metal catalyst, etc.; and as commercial products of such carbon nanotubes, there is mentioned HiPco-CNT (by CNI).

In general, the structure of CNT is primarily defined by a chiral index composed of a pair of two integers (n, m). Metallic CNT and semiconducting CNT as referred to in the invention are classified from carbon nanotubes in accordance with the electric properties thereof. Metallic. CNT are defined as those having a chiral index of n−m=(multiple of 3); and semiconducting CNT are as the others (having a chiral index, n−m=not multiple of 3) (Non-Patent Reference 8).

Non-Patent Reference 8: Riichiro Saito & Hisanori Shinohara, "Basis and Application of Carbon Nanotubes" by Baifukan In separating carbon nanotubes into metallic and semiconducting ones according to the method of the invention, it is important that CNT is first mixed in a suitable solvent containing a surfactant or the like to thereby make them disperse and solubilize therein so that CNT are kept stable therein for a long period of time.

As the solvent to be used herein, for example, water is most preferred.

As the surfactant, usable is any of anionic surfactants, cationic surfactants, ampholytic surfactants and nonionic surfactants; but preferred are anionic surfactants, more preferred are alkyl sulfate salts having from 10 to 14 carbon atoms, and even more preferred are sodium dodecyl sulfate (SDS) having 12 carbon atoms, sodium tetradecyl sulfate (STS) having 14 carbon atoms, and sodium cholate (SC). These surfactants may be used as combined together, or may be combined with any other surfactants. The surfactants to be combined may be any of anionic surfactants, cationic surfactants, ampholytic surfactants, nonionic surfactants as well as other dispersants such as high-molecular polymers, DNA, proteins, etc.

Preferably, the dispersion is ultrasonically processed for enhancing the solubility and the static stability thereof.

According to the method, the concentration of carbon nanotubes in the dispersion can be from 1 μg/ml to 10 mg/ml, preferably from 0.1 mg/ml to 1 mg/ml.

As the process of preparing the CNT sealed gel, other various methods may be taken into consideration, in addition to the method of mixing a CNT solution dispersed with a surfactant or the like (CNT dispersion) and a dissolved solution of a gel such as agarose or the like, followed by cooling and gelling the mixture, and such other methods include a method of electrically introducing a CNT dispersion into a gel as shown in FIG. 1; a method of mixing a CNT dispersion with acrylamide or the like followed by gelling the mixture through addition of a polymerization initiator thereto; a method of permeating a CNT dispersion into a dried gel; a method of dipping one surface of a previously prepared gel in a CNT dispersion with putting paper towels folded many times on the other surface thereof, thereby making CNT permeate into the gel through capillarity, etc. However, any other methods may also be employed with no problem.

The gel concentration of the CNT sealed gel may vary depending on the type and the concentration of the CNT used, the type of the gel used, etc.; but in general, the final gel concentration may be preferably from 0.01% to 25%.

Regarding the type of the gel for use for the carbon nanotube sealed gel, employable is any known polymer gel such as agarose gel, acrylamide gel, starch gel, etc.

In preparing the CNT scaled gel, a CNT dispersion and an agarose gel solution are mixed and cooled; and the cooling condition in gelling may be spontaneous cooling at room temperature (15 to 25° C.).

In this method, CNT are sealed in a get and an electric voltage is applied thereto, whereby metallic CNT alone may be removed from the gel. As the medium for electrophoresis, employable are gel, solution, etc. For example, the CNT sealed, gel is kept in contact with a separating gel prepared separately and is electrophoresed in that direction, whereby the metallic CNT released from the CNT sealed gel may be separated in the separating gel in accordance with the level of the molecular weight thereof. When the CNT sealed gel is fixed in a solution and electrophoresed therein, then the metallic CNT can be collected in the solution. When the CNT sealed gel is put on a filer and electrophoresed thereon, then the metallic CNT can be collected on the filter. In addition, any other methods may also be employed with no problem.

Regarding the condition of electrification, the level of the voltage to be applied may be selected in accordance with the system situation; and for example, a direct current at from 10 to 100 V or so may be applied. The electrophoresis temperature may also be selected in accordance with the system situation; and for example, it may be from 15 to 30° C. or so.

In the electrification step, an electrophoresis apparatus and a buffer generally used in ordinary gel electrophoresis may be directly used as they are.

The electrophoresis apparatus may be any known one such as a disc-type, submarine-type, slab-type or the like apparatus.

As the electrophoresis buffer, usable are various buffers having a different pH from acidic to bask. For example, usable are TB buffer (50 mM trishydroxymethylaminomethane, 48.5 mM boric acid (pH 8.2)), TAE buffer (40 mM trishydroxymethylaminomethane, 20 mM acetic acid, 1 mM ethylenediaminetetraacetic acid (pH 8.0)), etc. If desired, a surfactant or the like may be added to the buffer.

[Preparation of CNT Dispersion Solution]

Synthesized CNT makes tens to hundreds of bundles of both metallic and semiconducting CNT; and prior to separating them into metallic CNT and semiconducting CNT, the bundles must be separated into individual ones isolated from each other.

A solution containing a dispersant such as a surfactant or the like is added to the metallic/semiconducting CNT mixture, and then fully sonicated whereby the bundled CNT are individually dispersed and isolated from each other. The dispersion solution contains isolated CNT, CNT still in the form of bundles as not isolated, amorphous carbon as a side product, and metal catalyst, etc.

After the ultrasonic treatment, the dispersion is centrifuged, whereby the CNT bundles, amorphous carbon and metal catalyst are precipitated, and the isolated CNT forming a micelle with a surfactant can be collected in the supernatant. This solution is the sample for use in electrophoresis.

[Preparation of CNT Sealed Gel]

The "CNT sealed gel" where CNT are dispersed in a gel may be prepared by mixing the CNT dispersion solution and an agarose gel solution dissolved under heat, followed by spontaneously cooling it for gellation. A CNT dispersion may be electrically introduced into a gel, as shown in FIG. 1. The buffer and the surfactant in the CNT sealed gel may be substituted by dipping the gel in a solution containing any suitable buffer and surfactant. A mixture of a CNT dispersion and a dissolved agarose gel solution may be added directly onto a separating gel previously prepared in a glass tube or the like to give the intended CNT sealed gel through gellation therein; or a CNT sealed gel previously prepared in a different container may be put on a separating gel.

[Electrophoresis]

As the buffer for electrophoresis, any other buffer than TB may also be used. If desired, a surfactant may be added to the buffer. Regarding the method of electric field control, any of constant voltage or constant current may be employed with no problem, and a pulse-field electrophoresis method may also be applied to the invention where the electric field direction is changed at predetermined intervals as in polymer DNA separation.

In general, substances are separated depending on the size of the molecular weight thereof in gel electrophoresis; and therefore in the invention, when a separating gel having a suitable gel concentration is used, then metallic CNT and semiconducting CNT may be separated from each other and, at the same time, the metallic CNT may be separated from each other depending on the length or the thickness thereof.

[Photoabsorption Spectrometry]

For estimating the ratio of metallic/semiconducting CNT, used is UV-visible-near IR photoabsorption spectrometry. As an example, the data in FIG. 1 are described where Laser-CNT (thin; diameter 1.2±0.1 nm) are used. The absorption wavelength band referred to as M1 (about 500 to 700 nm) is derived from metallic CNT; and the two absorption wavelength bands S2 (about 700 to 1050 nm) and S3 (at most about 500 nm) are from semiconducting CNT. From the ratio of the M1 peak size to the S2 peak size, the ratio of metallic/semiconducting CNT is estimated. The absorption wavelength bands (M1, S2, S3) vary depending on the mean diameter of CNT to be analyzed; and thinner CNT give the bands shifted on the shorter wavelength side, while thicker CNT give them sifted on the longer wavelength side.

Regarding the method for measurement, the electrophoresed gel may be cut out and then diluted with a suitable solution, and the solution may be analyzed; or the gel may be directly analyzed for measurement. The gel kept in a container such as a glass tube or the like may be analyzed directly as it is therein, and real-time measurement is also possible. The metallic/semiconducting absorption wavelength bands can be estimated from the diameter distribution of the CNT used.

As in the above, according to the invention, metallic CNT and semiconducting CNT may be heavily and efficiently separated and purified from each other in CNT containing both the two within a short period of time by the use of inexpensive facilities and according to a simple process.

The method can be readily scaled up, and can be said to be an industrially extremely advantageous CNT separation method.

EXAMPLES

The invention is described in more detail with reference to the following Examples.

Example 1

Preparation of Laser-CNT (Thin)

A powder of nickel oxide and cobalt oxide was added to a high-purity graphite powder having a mean particle size of 5 microns, in a molar concentration ratio of 0.6% each, and uniformly mixed. With a phenolic resin, this was shaped and solidified as rods, and sintered in an inert gas at 1200° C. for 2 hours to prepare a target. The target was put in a quartz tube filled with an atmosphere of argon gas at 760 Torr, and the quartz tube was wholly heated up to 1050° C. with introducing an argon gas thereinto at a rage of about 100 cc/min. The target surface was irradiated with Nd:YAG laser rays at 450 mJ/pulse, whereby carbon, nickel and cobalt were evaporated. These aggregated in an electric furnace to form single-wall carbon nanotubes adhering to the quartz tube, and the carbon nanotubes were collected to be a material sample. The material sample was dispersed in water having a hydrogen peroxide concentration of 15%, refluxed at 100° C. for 2 hours, and then the catalyst metal was removed with hydrochloric acid to give purified Laser-CNT (thin: diameter 1.2±0.1 nm).

[Preparation of CNT Dispersion]

Aqueous 2% SDS solution (2 ml) was added to 0.6 g of Laser-CNT (thin: diameter 1.2±0.1 nm). The solution was sonicated using a tip-type ultrasonic homogenizer (Taitec's VP-15; tip diameter 3 mm). In this step, the container was kept cooled in water with ice, and processed in repeated cycles of 0.7 second ON-0.3 second OFF at an output level of 2, for a total of 5.7 hours (total ON-time, 4 hours). After the ultrasonic treatment, the dispersion was centrifuged (16,000× g, 15 hours, 25° C.), and then the supernatant was collected. The solution contains many CNT isolated and dispersed with surfactant.

[Preparation of Gel Solution for Sealing CNT Sample]

A solution was prepared by completely dissolving a 2-fold concentration of TB buffer containing 0.8% low-melting-point agarose by the use of a microwave oven, just before casting a CNT sealed gel onto a sample separating gel and solidifying it.

[Gel Electrophoresis of CNT Sample Previously-Sealed Gel]

For gel electrophoresis, herein used was an Atto's disc gel electrophoresis apparatus. Disc gel electrophoresis is electrophoresis where all the other sides than the side in the electrophoresis direction are isolated from the external world such as buffer, etc. The sample separating gel for electrophoresis (0.4% low-melting-point agarose, surfactant having a concentration of 1/10 of that used in ultrasonic dispersion [in this, 0.2% SDS], TB buffer) was formed in a glass tube having a length of 10 cm, an outer diameter of 7 mm and an inner diameter of 5 mm. Next, the above-mentioned CNT dispersion and the gel solution for sealing CNT sample dissolved by the use of a microwave oven just before the test were quickly mixed in an amount equivalent to each other, and before gelled, this was cast onto the sample separating gel, using a pipette. Next, this was left cooled at room temperature for about 30 minutes until the cast mixture could gel. Next, a TB buffer containing a surfactant having a concentration of 1/10 of that used in ultrasonic dispersion (in this, 0.2% SDS) was used as the buffer for electrophoresis; and the sample was electrophoresed in the direction from the cathode to the anode at 50 V for 60 minutes. The state is shown in FIG. 2. When the CNT sealed gel was used as the start sample in electrophoresis, then a part of CNT existing in the CNT sealed gel moved into the separating gel from before the start of the gel electrophoresis (0 minute) to after 15 minutes thereof; but some CNT still remained and stayed in the CNT sealed gel. After 30 minutes, all the movable CNT moved into the separating gel, while on the other hand, some CNT in the CNT sealed gel were still kept therein without being electrophoresed. These colors quite differ from each other; and those in the CNT sealed gel were green, but those moved into the separating gel were bluish gray. The green color is characteristic of semiconducting Laser-CNT (thin), and the bluish gray is characteristic of metallic Laser-CNT (thin).

[Photoabsorption Spectrometry]

Figure 3:
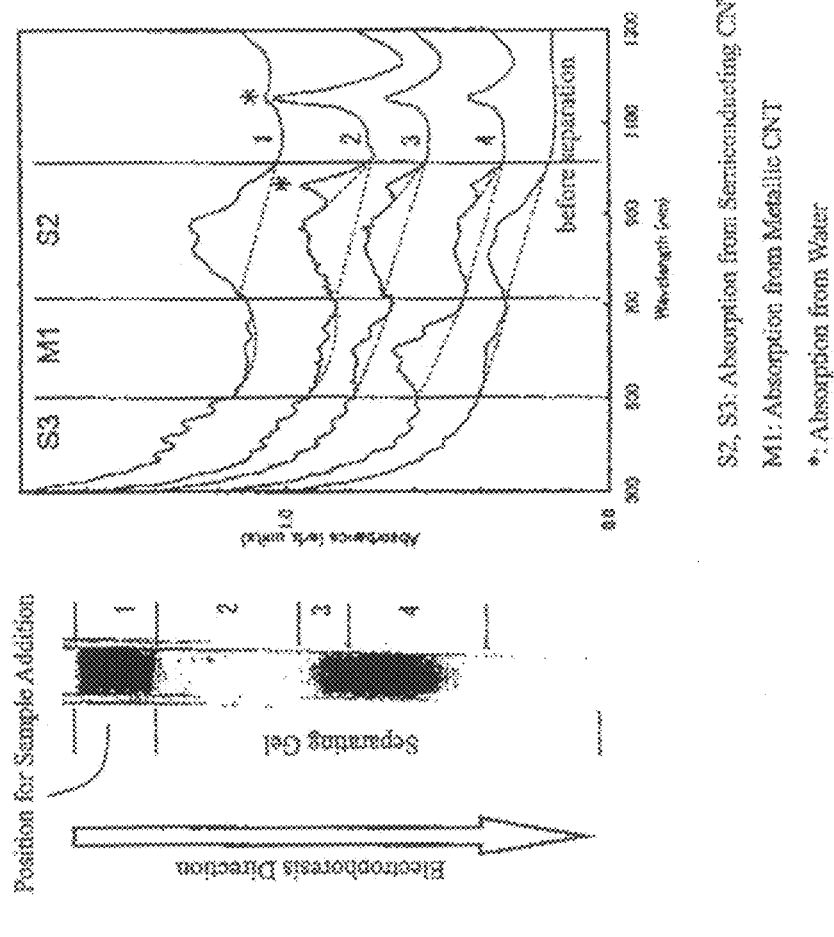
FIG. 3 Gel picture and photoabsorption spectrum of CNT sealed gel (Example 1) (Laser-CNT (thin), SDS) after electrophoresis.

After the electrophoresis, the gel was taken out of the glass tube, and cut at suitable positions. 2% SDS solution was applied to each gel fragment, dissolved in a hot bath, and analyzed for photoabsorption spectrometry with a UV-visible-near IR spectrophotometer (Shimadzu Solid Spec-3700). The picture after electrophoresis and the photoabsorption spectra are shown in FIG. 3.

The spectrum (1) of CNT having remained in the CNT sealed gel confirms little absorption (M1) derived from metallic CNT and extremely strong absorption (S2) from semiconducting CNT, therefore indicating separation of very high purity semiconducting CNT. On the contrary, at the part (4) near to the electrophoresis tip, the semiconducting CNT absorption (S2) decreased as compared with that of the sample before separation while the absorption (M1) derived from metallic CNT significantly increased, therefore indicating efficient separation of metallic CNT. The spectra at the intermediate parts (2) and (3) indicate a mixture of metallic and semiconducting CNT not so much differing from the unseparated sample; however, in view of the thinness of the color on the picture, the amount of the mixture is extremely small. In other words, it is known that a major part (at least 90%) of the sample initially processed for electrophoresis exists in the fractions of (1) and (4) where semiconducting and metallic CNT were separated from each other. The above result confirms that high-purity metallic CNT and semiconducting CNT were separated and collected both at an extremely high collection rate.

Example 2

Preparation of Laser-CNT (Thick)

Laser-CNT (thick: diameter 1.4±0.1 nm) were produced according to the same experimental process as in Example 1 [preparation of Laser-CNT (thin)], for which, however, the temperature in CNT production was changed from 1050° C. to 1250° C.

Figure 4:
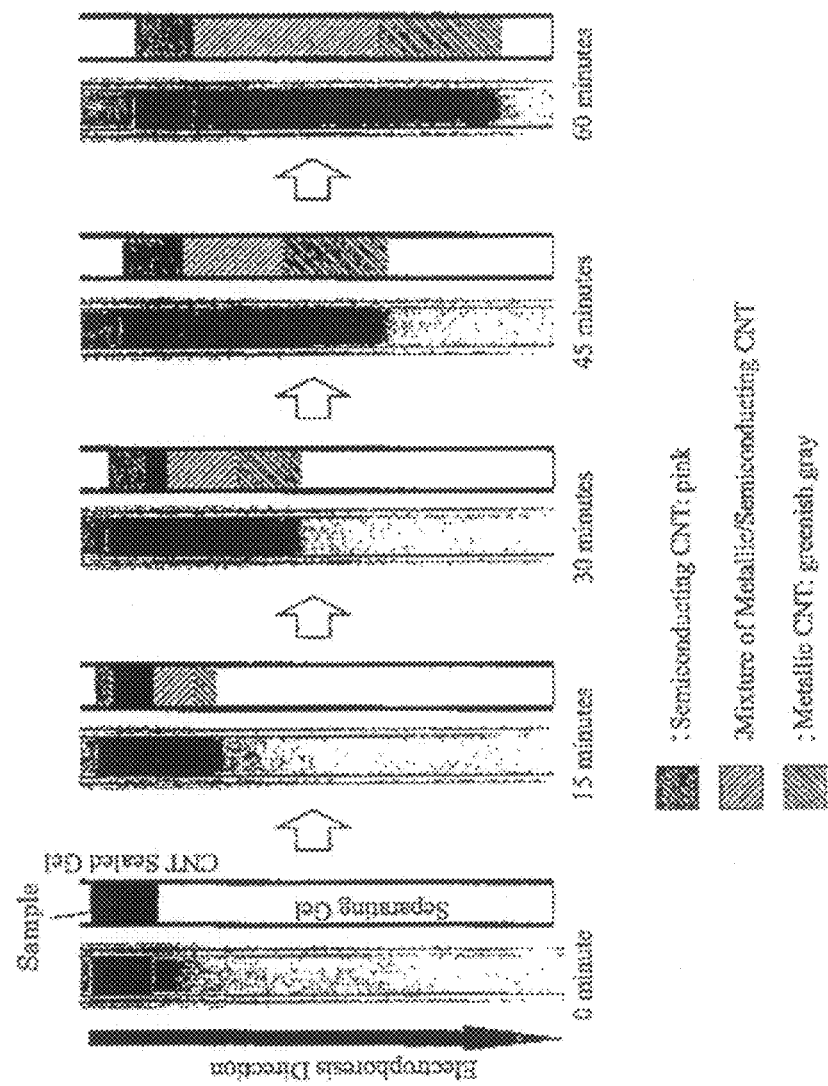
FIG. 4 Successive pictures and graphic views in electrophoresis of CNT sealed gel (Example 2) (Laser-CNT (thick), SDS).
Figure 5:
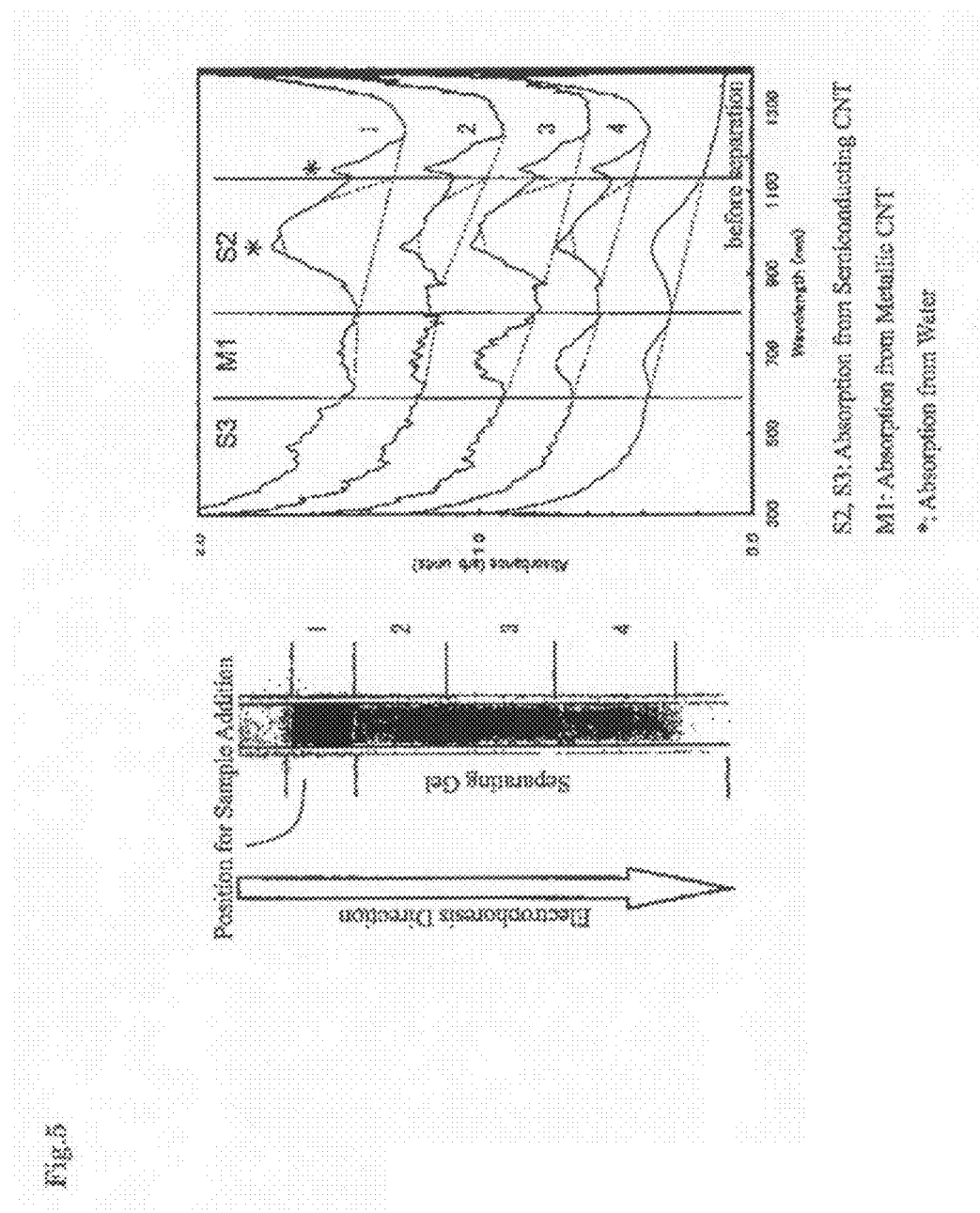
FIG. 5 Gel picture and photoabsorption spectrum of CNT sealed gel (Example 2) (Laser-CNT (thick), SDS) after electrophoresis.

Using the produced Laser-CNT (thick), the same experiment as in Example 1 was carried out. FIG. 4 shows a state of the gel in electrophoresis. Having a different thickness, metallic CNT and semiconducting CNT differ from each other in point of the absorption wavelength, and therefore, the two differ in point of the color of the appearance thereof. A part of CNT existing in the CNT sealed gel moved into the separating gel from before the start of the gel electrophoresis (0 minute) to after 15 minutes to 30 minutes thereof; but some CNT still remained and stayed in the CNT sealed gel. After 45 minutes, all the movable CNT moved into the separating gel, while on the other hand, some CNT in the CNT sealed gel were still kept therein without being electrophoresed. These colors quite differ from each other; and those in the CNT sealed gel were pink, but those moved into the separating gel were greenish gray. The pink color is characteristic of semiconducting Laser-CNT (thick), and the greenish gray is characteristic of metallic Laser-CNT (thick). The picture of the gel after electrophoresis and the photoabsorption spectra are shown in FIG. 5. Also in this case, like in Example 1, the CNT (1) having remained in the sample sealed gel confirms strong absorption (S2) derived from semiconducting CNT, or that is, semiconducting CNT were separated. On the contrary, at the electrophoresis tip part (4), the absorption (M1) increased, or that is, metallic CNT were separated. The spectra at the intermediate parts (2) and (3) indicate a mixture of metallic and semiconducting CNT not so much differing from the unseparated sample.

Example 3

Figure 6:
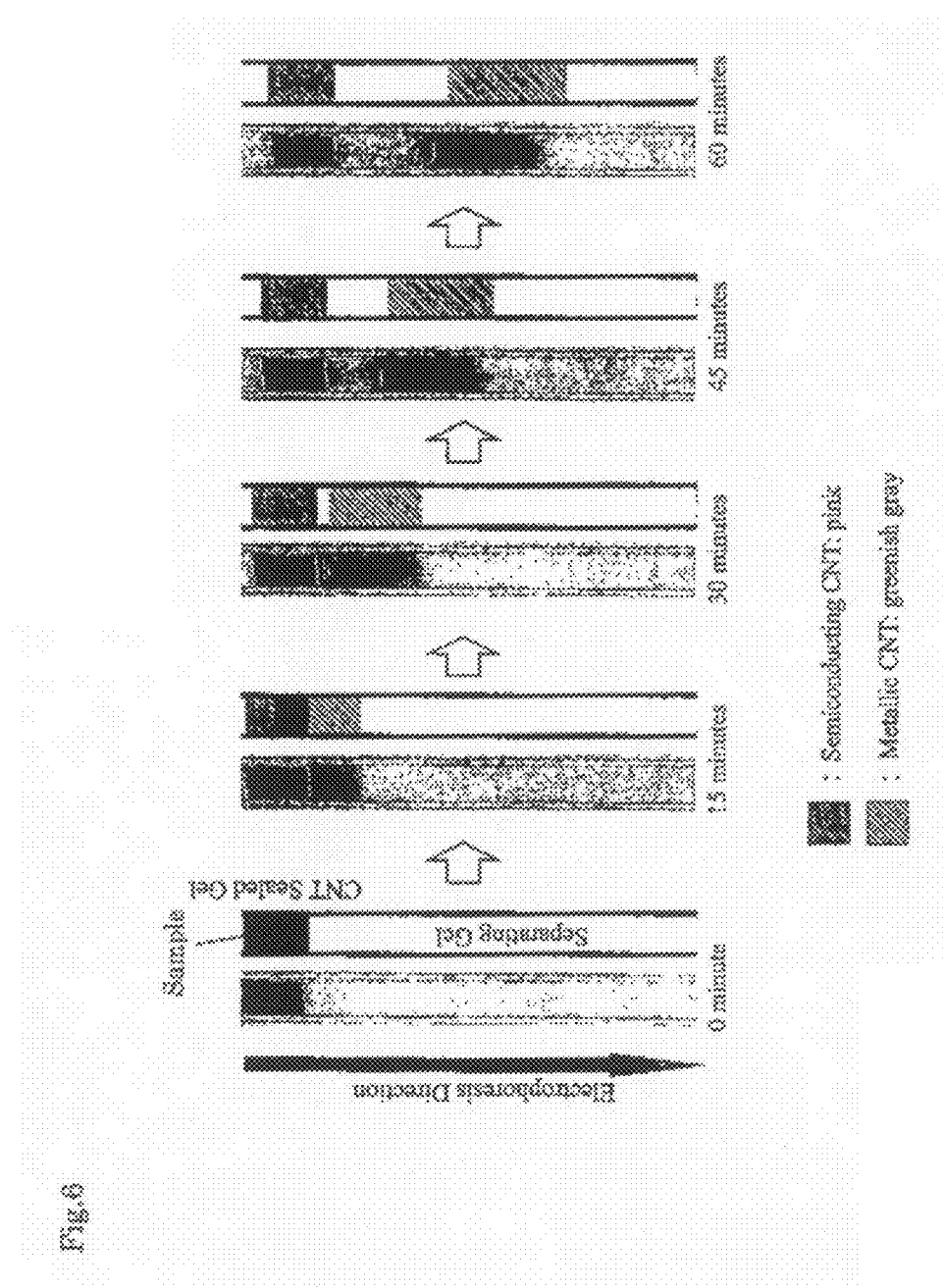
FIG. 6 Successive pictures and graphic views in electrophoresis of CNT sealed gel (Example 3) (Laser-CNT (thick), SDS-SC).
Figure 7:
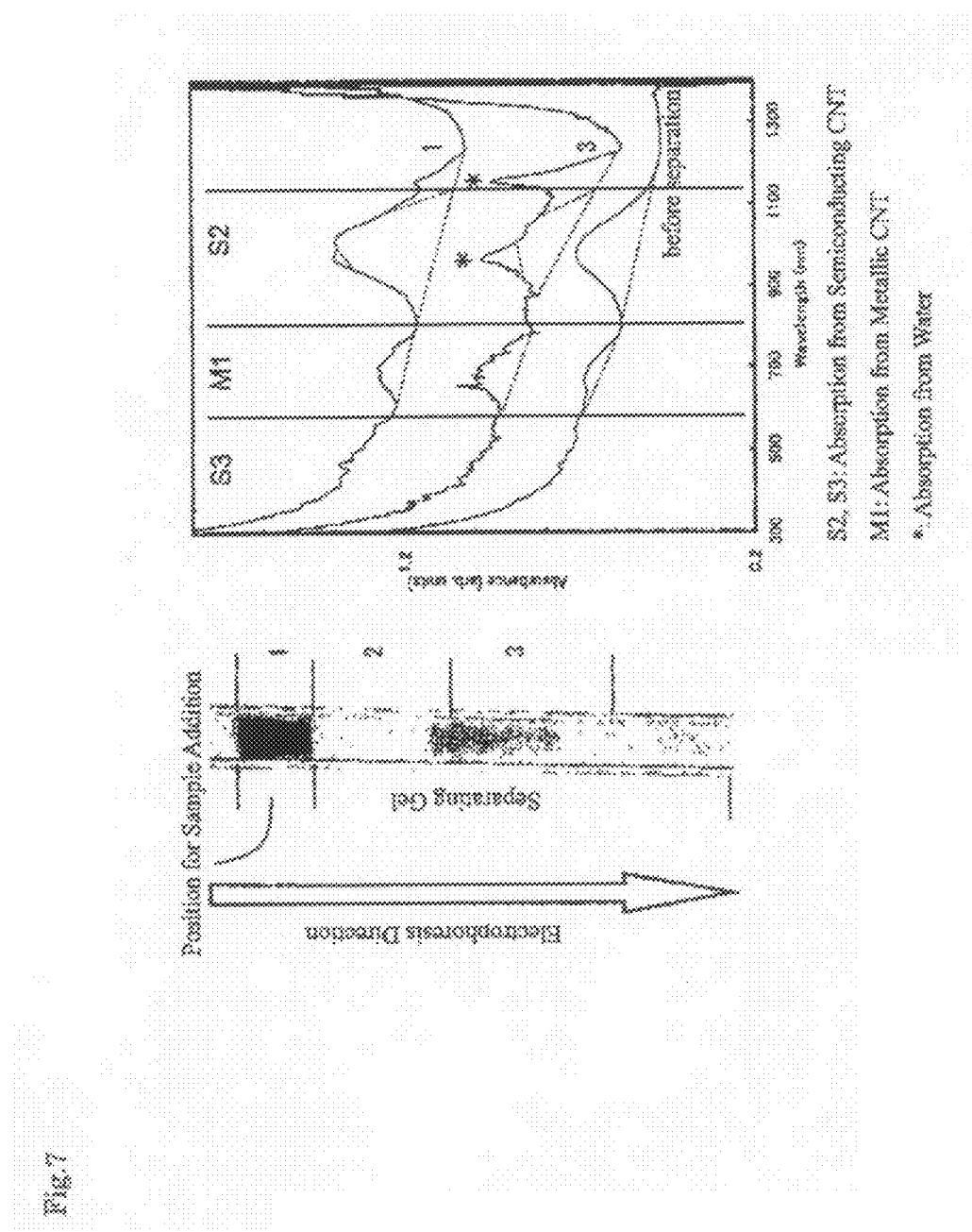
FIG. 7 Gel picture and photoabsorption spectrum of CNT sealed gel (Example 3) (Laser-CNT (thick), SDS-SC) after electrophoresis.

The same dispersion experiment as in Example 2 was carried out, in which, however, a mixture of 1.2% SDS-0.8% sodium cholate (SC) was used in place of 2% SDS as the surfactant. FIG. 6 shows a state of the gel in electrophoresis. A part of CNT existing in the CNT sealed gel moved into the separating gel from before the start of the gel electrophoresis (0 minute) to after 15 minutes thereof; but some CNT still remained and stayed in the CNT sealed gel. After 30 minutes, all the movable CNT moved into the separating gel, while on the other hand, some CNT in the CNT sealed gel were still kept therein without being electrophoresed. These colors quite differ from each other; and those in the CNT sealed gel were pink, but those moved into the separating gel were greenish gray. The pink color is characteristic of semiconducting Laser-CNT (thick), and the bluish gray is characteristic of metallic Laser-CNT (thick). The picture of the gel after electrophoresis and the photoabsorption spectra are shown in FIG. 7. Also in this case, like in Example 1 and 2, the CNT (1) having remained in the CNT scaled gel confirms strong absorption (S2) derived from semiconducting CNT, or that is, semiconducting CNT were separated. On the contrary, at the electrophoresis tip part (4), the absorption (M1) increased, or that is, metallic CNT were separated. At the intermediate part (2), the signal intensity was weak, therefore not giving a spectrum.

Example 4

Figure 8:
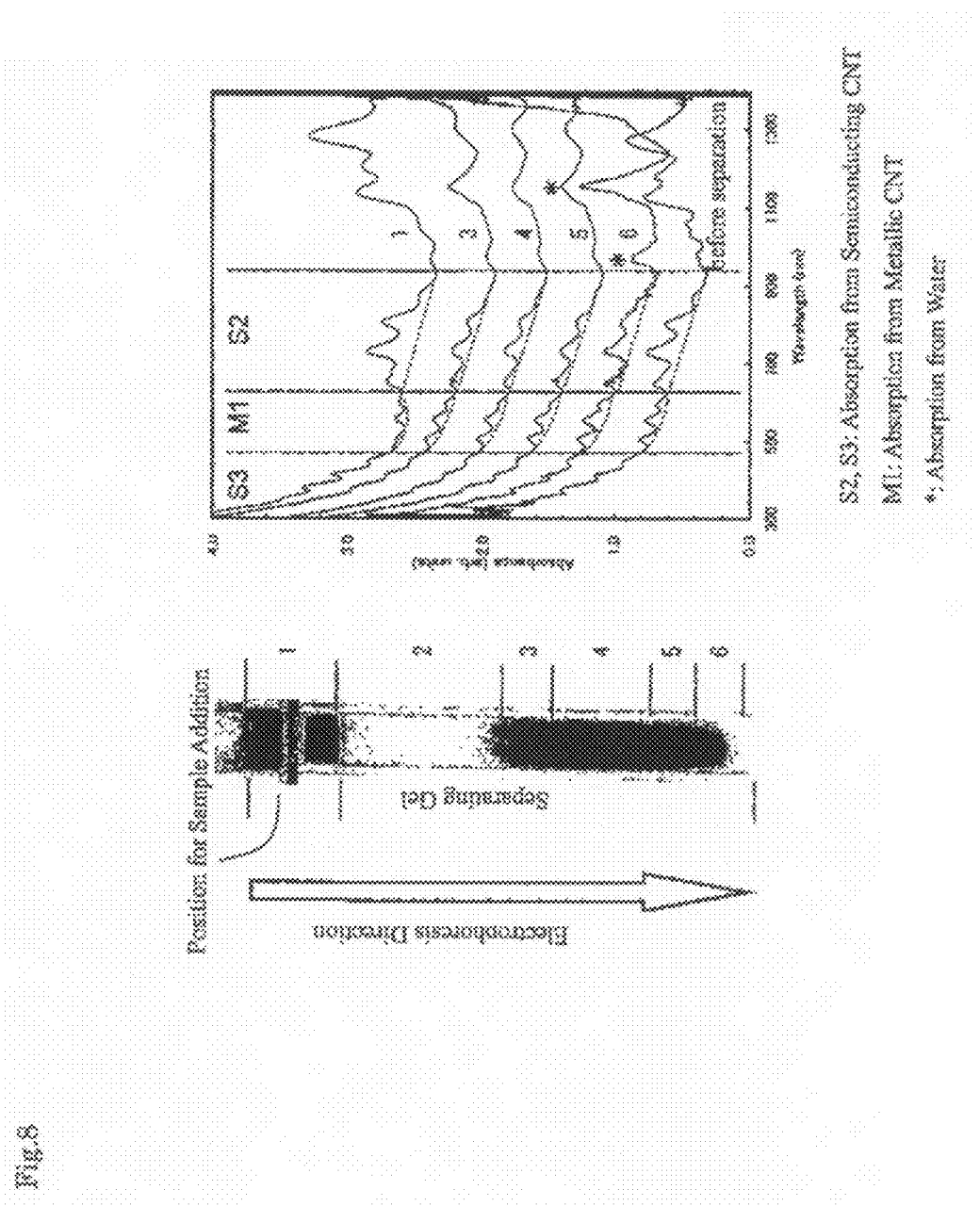
FIG. 8 Gel picture and photoabsorption spectrum of CNT sealed gel (Example 4) (HiPco-CNT, SDS-SC) after electrophoresis.

The same dispersion experiment as in the above Example 1 was carried out, in which, however, Hipco-CNT (diameter 1.0±0.3 mm) were used as CNT and a mixture of 1.2% SDS-0.8% SC was used in place of 2% SDS as the surfactant. The picture of the gel after electrophoresis and the photoabsorption spectra are shown in FIG. 8. Also in the case with HiPco-CNT, the absorption (M1) from the metallic CNT decreased in the sample sealed gel (1), while the absorption (S2) from the semiconducting CNT increased. On the other hand, in the CNT moved into the separating gel (fractions of (3) to (6)), the absorption (M1) from the metallic CNT increased relative to the absorption (S2) from the semiconducting CNT as compared with the unseparated sample. In other words, HiPco-CNT could also be separated into semiconducting CNT and metallic CNT. The signal intensity from the fraction (2) was weak, therefore producing no spectrum.

Example 5

Figure 9:
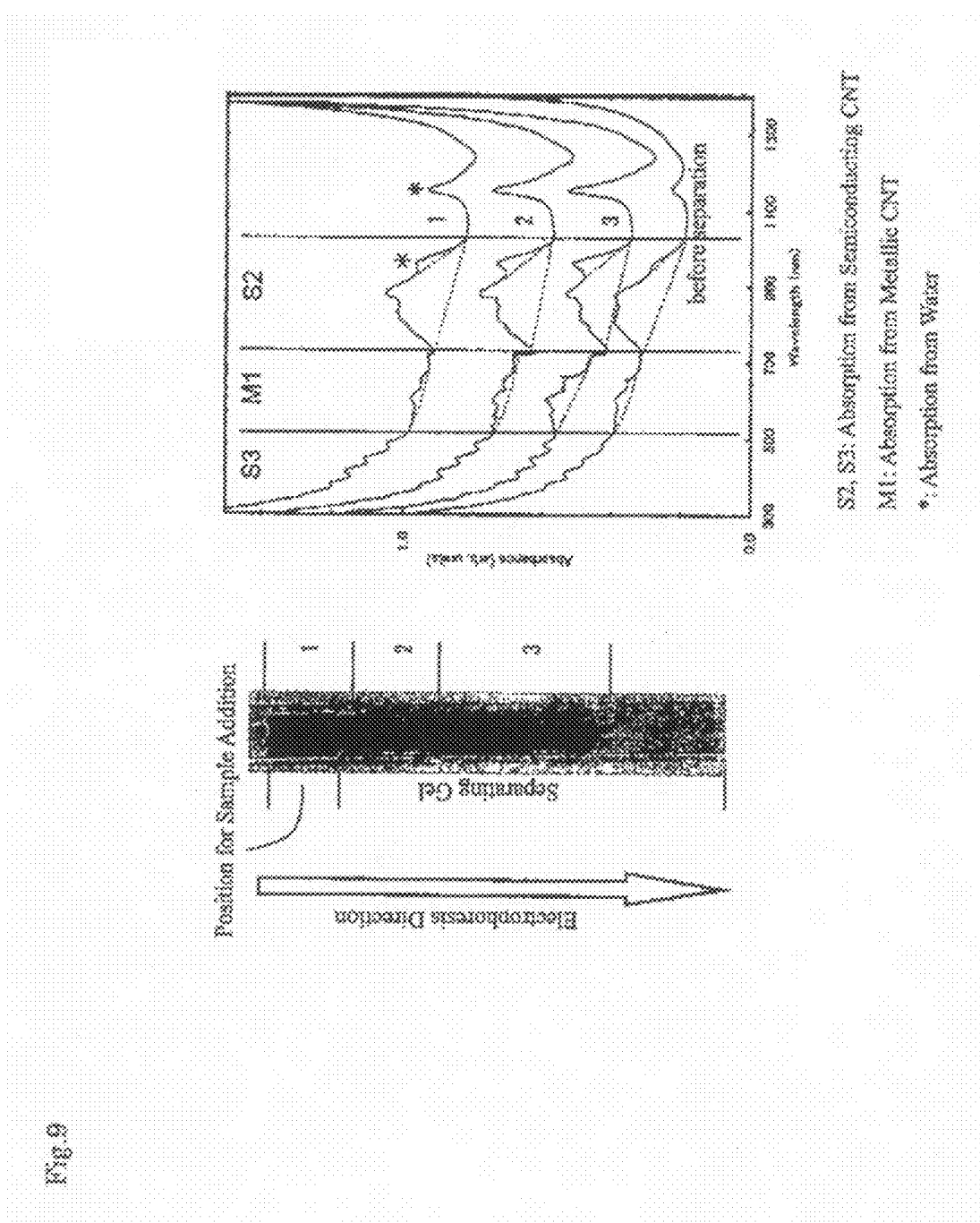
FIG. 9 Gel picture and photoabsorption spectrum of CNT sealed gel (Example 5) (Laser-CNT (thin), STS) after electrophoresis.

The same experiment as in the above Example 1 was carried out, in which, however, 2% sodium tetradecyl sulfate (STS) was used in place of 2% SDS as the surfactant. In this experiment, STS precipitates at a low temperature, and the ultrasonic homogenization was attained not cooled with ice but cooled with water, and the temperature in centrifugation was changed to 40° C. The other conditions were the same as in Example 1. The picture of the gel after electrophoresis and the photoabsorption spectra are shown in FIG. 9. Also in this case where STS was used, the semiconducting CNT were separated in the sample sealed gel (1) while the metallic CNT were in (3) of the separating gel.

Example 6

Figure 10:
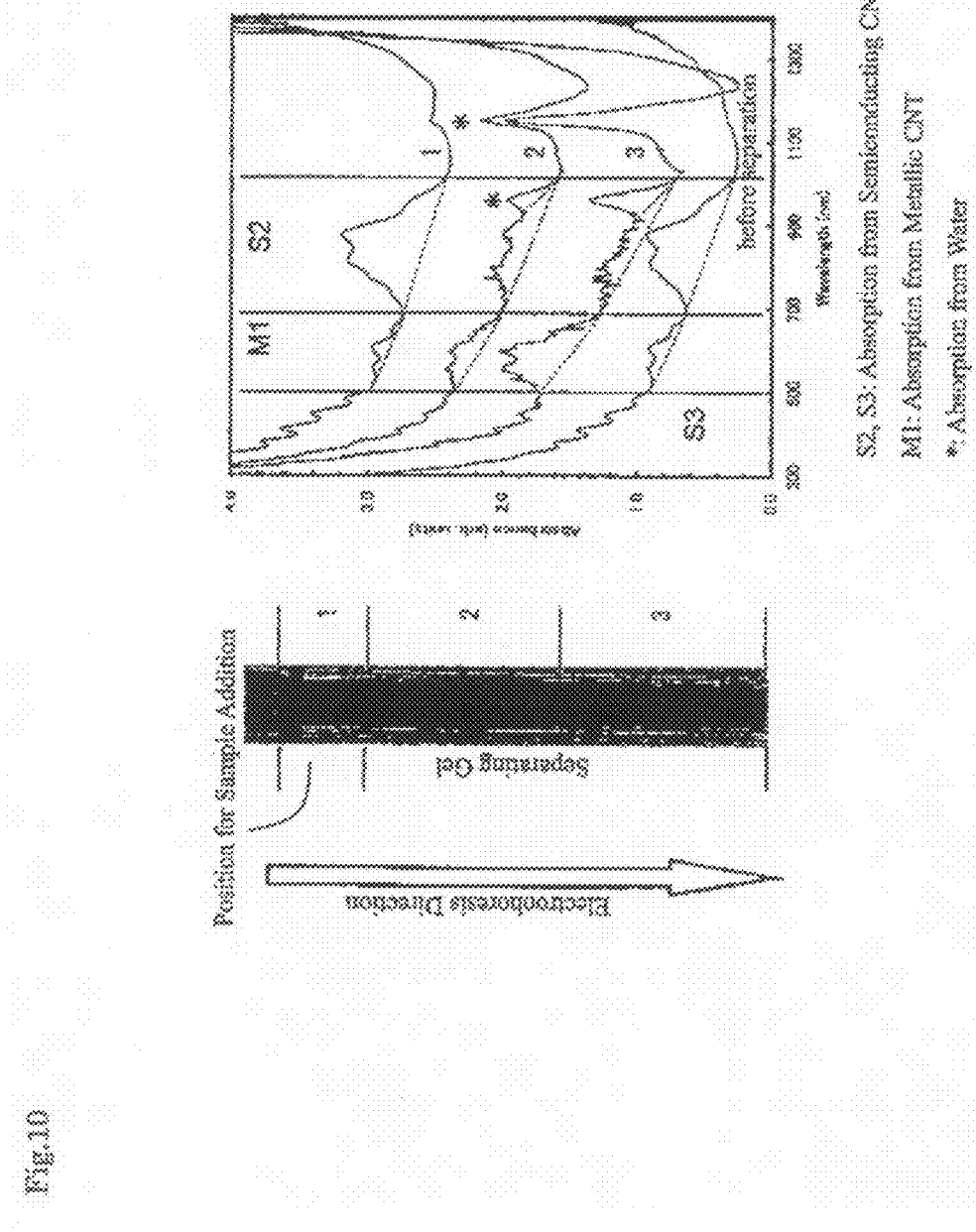
FIG. 10 Gel picture and photoabsorption spectrum of CNT sealed gel (Example 6) (Laser-CNT (thin), SC) after electrophoresis.

The same experiment as in the above Example 1 was carried out, in which, however, 4% SC was used in place of 2% SDS as the surfactant. The picture of the gel after electrophoresis and the photoabsorption spectra are shown in FIG. 10. In this case where SC was used, the proportion of the semiconducting CNT increased in the sample sealed gel (1), while on the other hand, the proportion of the metallic CNT increased in (2) and (3) of the separating gel, and in particular, it significantly increased in (3) nearer to the electrophoresis tip. This indicates that the use of the surfactant SC alone also enables separation and purification of semiconducting CNT and metallic CNT from each other.

In all Examples 1 to 6 mentioned above, the optical analysis of CNT in the gel having moved and kept in the glass tube after electrophoresis may be attained according to direct analysis thereof still kept in the glass tube without being dissolved in a solution, apart from the above-mentioned method where the gel is once dissolved in a solution and then analyzed.

The invention claimed is:

1. A carbon nanotube separation method comprising:
a step of putting a separation medium for electrophoresis into a separation container,
a step of putting a carbon nanotube sealed gel which comprises a gel and carbon nanotubes dispersed in the gel into the separation container, and
a step of electrophoresis comprising electrifying the separation container containing the separation medium for electrophoresis and the carbon nanotube sealed gel,
wherein:
a semiconducting carbon nanotube region is formed in the carbon nanotube sealed gel,
a mixed region of metallic carbon nanotubes and semiconducting carbon nanotubes is formed,
a metallic carbon nanotube region is formed in the separation medium, and
a proportion of the metallic carbon nanotubes to the semiconducting carbon nanotubes in the separation medium is larger than a proportion of the metallic carbon nanotubes to the semiconducting carbon nanotubes in the carbon nanotube sealed gel.

2. A carbon nanotube separation method comprising:
a step of putting a separation medium for electrophoresis into a separation container,
a step of putting a carbon nanotube sealed gel which comprises a gel and carbon nanotubes dispersed in the gel into the separation container, and
a step of electrophoresis comprising electrifying the separation container containing the separation medium for electrophoresis and the carbon nanotube sealed gel,
wherein:
a semiconducting carbon nanotube region is formed in the carbon nanotube sealed gel,
a metallic carbon nanotube region is formed in the separation medium, and
a proportion of the metallic carbon nanotubes to the semiconducting carbon nanotubes in the separation medium is larger than a proportion of the metallic carbon nanotubes to the semiconducting carbon nanotubes in the carbon nanotube sealed gel.

3. The carbon nanotube separation method as claimed in claim 1 or 2, wherein the electrophoresis step comprises insulating the separation medium and the carbon nanotube sealed gel from electrical current except for on a side in the direction of the electrophoresis.

4. The carbon nanotube separation method as claimed in claim 1 or 2, wherein the carbon nanotube sealed gel further comprises a surfactant.

5. The carbon nanotube separation method as claimed in claim 4, wherein the surfactant is an anionic surfactant.

6. The carbon nanotube separation method as claimed in claim 5, wherein the anionic surfactant is an alkyl sulfate salt, sodium cholate, or a mixture of an alkyl sulfate salt and sodium cholate.

7. The carbon nanotube separation method as claimed in claim 6, wherein the alkyl sulfate salt is sodium dodecyl sulfate or sodium tetradecyl sulfate.

8. The carbon nanotube separation method as claimed in claim 1 or 2, wherein the separation medium is a gel.

* * * * *